(12) United States Patent
Kuwada et al.

(10) Patent No.: US 6,905,079 B2
(45) Date of Patent: Jun. 14, 2005

(54) SHOWER HEAD STRUCTURE AND CLEANING METHOD THEREOF

(75) Inventors: Tomonao Kuwada, Tsukui-gun (JP); Masatake Yoneda, Nirasaki (JP); Takashi Nishimori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 310 days.

(21) Appl. No.: 09/946,361

(22) Filed: Sep. 6, 2001

(65) Prior Publication Data

US 2002/0029748 A1 Mar. 14, 2002

(30) Foreign Application Priority Data

Sep. 8, 2000 (JP) ........................................ 2000-272645

(51) Int. Cl.$^7$ ................................................ B05B 1/24
(52) U.S. Cl. .................. 239/13; 239/128; 239/135; 239/139; 239/548; 239/600; 118/715; 118/724; 118/725
(58) Field of Search .......................... 239/13, 128, 135, 239/139, 548, 600, DIG. 4; 118/715, 724, 725

(56) References Cited

U.S. PATENT DOCUMENTS 5,595,606 A    1/1997  Fujikawa et al.
5,785,796 A *  7/1998  Lee .............................. 118/715
5,950,925 A *  9/1999  Fukunaga et al. ........... 239/139
6,036,782 A *  3/2000  Tanaka et al. ............... 118/715
6,302,964 B1 * 10/2001 Umotoy et al. ............. 118/715
6,453,992 B1 * 9/2002  Kim ............................ 118/715

FOREIGN PATENT DOCUMENTS

| JP | 2-137318 | 5/1990 |
| JP | 2-268429 | 11/1990 |
| JP | 6-326078 | 11/1994 |
| TW | 375780 | 12/1999 |

* cited by examiner

Primary Examiner—Steven J. Ganey
(74) Attorney, Agent, or Firm—Oblon, Spivak, McClelland, Maier & Neustadt, P.C.

(57) ABSTRACT

There is disclosed a shower head structure, disposed on a ceiling portion of a process chamber for subjecting a material to be treated to a film forming process, for supplying a predetermined gas, the structure comprising a head main body formed in a cup shape having a bottom with a plurality of gas injection holes opened therein, and formed integrally with a joining flange portion to be attached to the ceiling portion of the process chamber on an opening side of the cup shape, and a head heating portion, disposed on the bottom of the head main body, for adjusting the head main body at a desired temperature, so that the film forming process for enhancing reproducibility under a low temperature is performed and a reactive byproduct is removed under a high temperature.

46 Claims, 7 Drawing Sheets

SHOWER HEAD STRUCTURE AND CLEANING METHOD THEREOF

CROSS-REFERENCE TO RELATED APPLICATIONS

This application is based upon and claims the benefit of priority from the prior Japanese Patent Application No. 2000-272645, filed Sep. 8, 2000, the entire contents of which are incorporated herein by reference.

BACKGROUND OF THE INVENTION

1. Field of the Invention

The present invention relates to a shower head structure mounted in a film forming apparatus for using a process gas to form a film on a material to be treated, such as a semiconductor wafer, and a cleaning method of the structure.

2. Description of the Related Art

In a process of manufacturing a general semiconductor integrated circuit, in order to form a wiring pattern or fill a concave portion a recess provided between wires made metal such as tungsten (W), titanium (Ti), or copper (Cu), or metal compound such as tungsten silicide (WSi), titanium nitride (TiN), titanium silicide (TiSi), or tantalum oxide ($Ta_2O_5$) are deposited to form a thin film on the surface of a to-be-freated semiconductor wafer.

As methods of forming the thin metal film, three methods are known: a hydrogen ($H_2$) reducing method; a silane ($SiH_4$) reducing method; and a dichlorosilane ($SiH_2Cl_2$) reducing method. In these methods, the $SiH_2Cl_2$ reducing method comprises using, for example, dichlorosilane as a reduction gas to form a W or tungsten silicide (WSi) film at a high temperature of about 600° C. in order to form the wiring pattern. Moreover, similarly, to form the wiring pattern, the $SiH_4$ reducing method comprises using, for example, silane as the reduction gas to form a W or WSi film at a temperature of 450° C. or less than the temperature of the $SiH_2Cl_2$ reducing method. Furthermore, in order to fill a hole or the concave portion a recess provided between wires and flatten the surface of the wafer, the $H_2$ reducing method comprises using, for example, hydrogen as the reduction gas is used to deposit the W film at a temperature of about 380 to 430° C.

Additionally, a reducing method constituted by appropriately combining the aforementioned methods is also known and, for example, tungsten hexafluoride ($WF_6$) is used in these methods.

FIG. 9 shows a constitution example of a general film forming apparatus for forming the aforementioned thin metal film. Moreover, FIG. 10 is an enlarged view showing a shower head structure of FIG. 9 in detail.

Aluminum, or the like, is used to form the cylindrical shape of the process chamber 2. A susceptor 4 formed of a thin carbon material or an aluminum compound is disposed in the process chamber 2, and a heater 8 such as a halogen lamp is disposed under the base via a transmission window 6 formed of quartz.

A semiconductor wafer W carried from the outside is laid on the susceptor 4, and a peripheral edge of the wafer W is pressed by a clamp ring 10 constituted such that the ring can be raised/lowered, and fixed onto the susceptor 4. A shower head structure 12 formed, for example, of aluminum is disposed opposite to and above the susceptor 4. A large number of gas ejecting holes 14 are substantially uniformly arranged/formed on a lower surface of the shower head structure 12.

Moreover, for the shower head structure 12, in order to maintain a temperature to be steadily low to some degree during a film forming process, a heat transfer medium 16 (e.g., a Chiller (tradename)), for example, of about 50° C. is passed inside. The shower head structure 12 has a head main body 7, and the body is attached to a chamber ceiling portion 2a via a bolt 5 as shown in FIG. 10. An injection plate 11 with a large number of injection holes 9 formed therein is attached to the lower surface of the head main body 7 via a bolt 13.

A diffusion plate 17 with a large number of diffusion holes 15 formed therein is disposed in a space inside the head main body 7, so that gas introduced into the head main body 7 is diffused in the direction of a wafer surface. A shower base channel 18 is disposed in a side-wall portion of the head main body 7, and the heat transfer medium 16 is passed through the channel. Moreover, during the film forming process, the susceptor 4 is irradiated with heat rays from the heater 8 through the transmission window 6, and the semiconductor wafer W fixed onto the susceptor 4 is indirectly heated to obtain a predetermined temperature.

Additionally, when $WF_6$ or $H_2$ is uniformly supplied as the process gas onto the wafer surface from the gas injection hole 14 disposed above the susceptor 4, a metal film of tungsten is formed on the surface of the wafer.

The aforementioned film forming process comprises continuously processing a plurality of, for example, 25 wafers, one by one, into a film in a sheeting manner, and using $ClF_3$ or another cleaning gas to perform dry cleaning (flushing) for the purpose of removing excess film attached to the member in the process chamber 2, such as the base, clamp ring and shower head structure, during continuous film formation. In this manner, in general, the continuous film forming process and cleaning process are repeatedly performed over a plurality of wafers.

Additionally, in order to maintain electric properties, and the like of the deposited film formed on each wafer to be constant as designed, reproducibility needs to be maintained high so that the thickness of the film deposited on each wafer remains substantially constant. However, in practice, the film thickness obtained by performing the film forming process on a first wafer immediately after a cleaning process may be considerably different from that of the 25-th wafer, during continuous processing of 25 wafers. For example, when the number of wafers in a continuous processing is increased, the thickness of the film formed on the wafer tends to gradually decrease. Although the heat transfer medium 16 is passed through the shower base channel 18 of the shower head structure 12 during idling of the process chamber 2, temperature rises. Moreover, when the process gas is passed from the shower head structure 12 and the number of treated wafers increases, the temperature of the shower head structure 12, particularly the temperature of the gas injection plate gradually drops and settles at a desired temperature.

To solve the problem, the temperature of the gas injection plate of the shower head structure 12 is maintained to be low beforehand, and the continuous film forming process of the wafer is performed. However, when the gas injection plate of the shower head structure 12 is maintained at a relatively low temperature from the start of the processing, compounds relatively difficult to remove in the cleaning process, such as titanium fluoride ($TiF_x$) and other reactive byproducts are attached to the surface of the gas injection plate. The problem below newly arises. When some titanium atoms in a titanium containing film, such as a titanium metal film or titanium nitride film, already deposited on the surface of the wafer in the previous process react with fluorine of $WF_6$ gas supplied during the film forming process, titanium flouride is generated.

FIGS. 11A, 11B show a relation between the temperature of the gas injection plate of the shower head structure and the film thickness of the reactive byproduct attached to the shower head structure. FIG. 11A shows a characteristic of continuous processing of 25 wafers on tungsten metal films with a film thickness of 100 nm at a susceptor temperature of 410° C., and FIG. 11B shows the characteristic of the continuous processing of 25 wafers on tungsten metal films with a film thickness of 800 nm at a base temperature of 460° C.

As is apparent from these drawings, when the temperature of the gas injection plate of the shower head structure drops to about 80° C. from about 100° C., the film thickness of the reactive byproduct rapidly increases. Moreover, a general cleaning process comprises maintaining the temperature of the structure in the process chamber 2 to be substantially the same as the temperature in the film forming process, and passing a cleaning gas such as $ClF_3$ gas. In this case, an unwanted tungsten film attached to the susceptor 4, and the like is removed, but there is a problem that the reactive byproducts, such as titanium fluoride attached to the gas injection plate surface of the shower head structure, are not easily removed.

Moreover, there is a method of setting the temperature of the gas injection plate of the shower head structure during the film forming process to be relatively high, to prevent the reactive byproduct from being attached. However, depending upon the film forming conditions, the maximum temperature of the gas injection plate of the shower head structure limits the amount of byproducts that can be removed as they are best removed at temperatures above this. In this case, the amount of reactive byproducts continues to rise, thus limiting the number of wafers that can be treated in one batch, and a cleaning process is required in accordance with an amount of attached byproducts.

BRIEF SUMMARY OF THE INVENTION

An object of the present invention is to provide a shower head structure which is mounted on a film forming apparatus, in which the reproducibility of a film forming process is enhanced and can be maintained to be high, and in which the reactive byproducts attached during a film forming process can easily be removed in a short time, and to provide a cleaning method of the structure.

To achieve the object, according to the present invention, there is provided a shower head structure, disposed on a ceiling portion of a process chamber for subjecting a material to be treated to a film forming process, for supplying a predetermined gas into the process chamber, the shower head structure comprising: a head main body formed in a cup shape having a bottom with a plurality of gas injection holes therein, and formed integrally with a joining flange portion to be attached to the ceiling portion of the process chamber on an opening side of the cup shape; and a head heating portion, disposed on a side wall in the vicinity of a bottom of the head main body, for adjusting the head main body to a desired temperature.

Moreover, a bracket portion for reducing a sectional area of the side wall of the head main body disposed above the head heating portion and increasing heat resistance to a propagated heat is formed on the side wall.

The shower head structure further comprises a head heating/cooling portion, disposed on the joining flange portion, for cooling the head main body during the film forming process of the material to be treated, and heating the head main body during a cleaning process in the process chamber, and the temperature of the head main body is controlled in a range of 50 to 300° C. by the head heating portion and the head heating/cooling portion.

Moreover, there is provided a cleaning method into the film formation apparatus, for introducing process gas into the process chamber via a shower head structure, disposed in a film forming apparatus comprising a process chamber for performing a film forming process which deposits reactive byproducts on the surface of a heated material to be treated in an atmosphere of process gas, the cleaning method comprising steps of: passing a cleaning gas into the process chamber from the shower head structure; setting a temperature of a gas injection portion of the shower head structure to be higher than the temperature of the film forming process; and performing a cleaning process to remove the reactive byproduct generated during the film forming process.

The temperature of the gas injection portion of the shower head structure in the cleaning process is 130° C. or more, and the reactive byproduct containing a titanium fluoride (TiFx) based main component attached to the surface of the gas injection portion of the shower head structure is removed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A preferred embodiment of the present invention will be described in detail with reference to the drawings.

Figure 1:
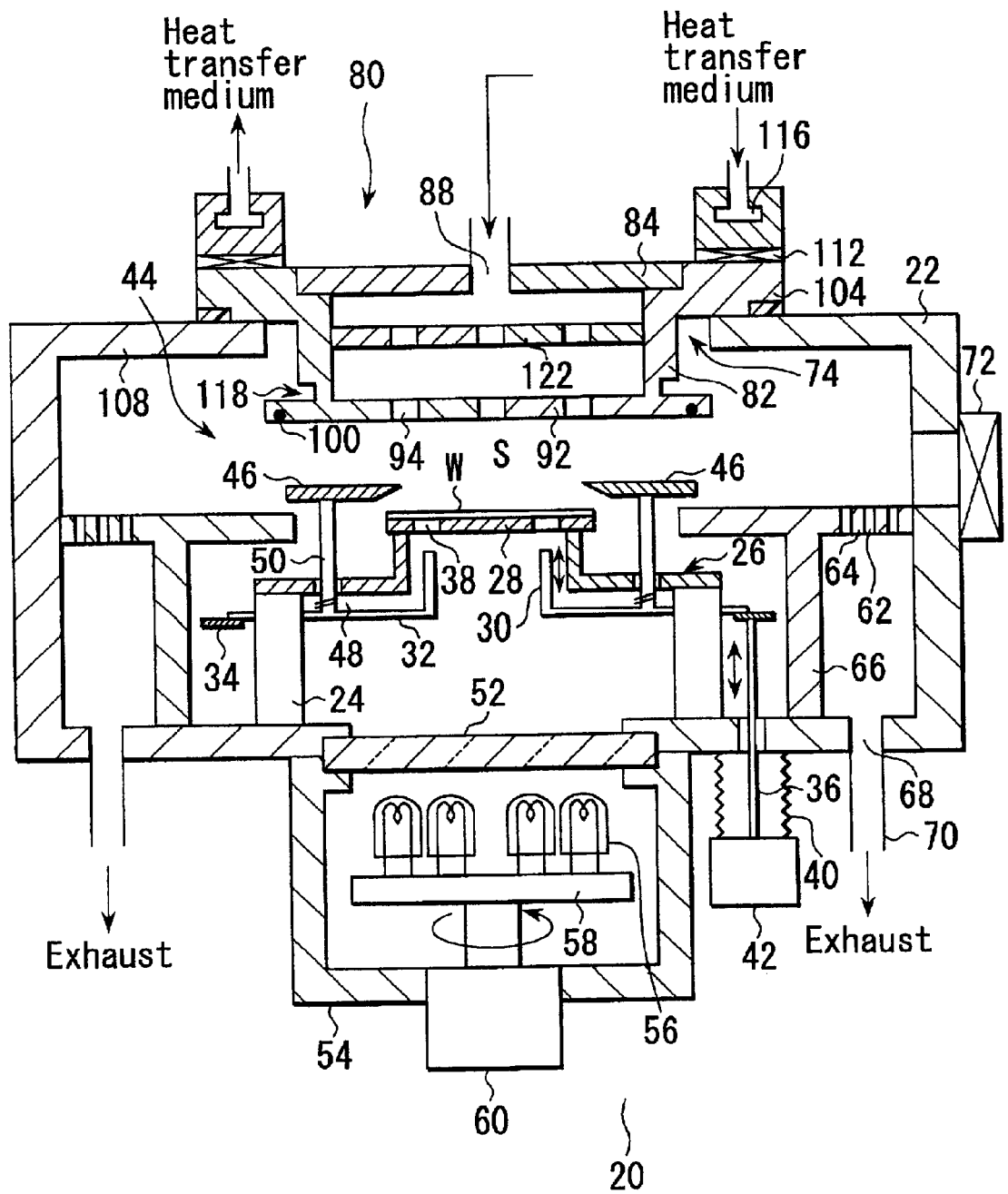
FIG. 1 is a sectional constitution diagram showing one constitution example of a film forming apparatus with a shower head structure of the present invention mounted thereon.
Figure 2:
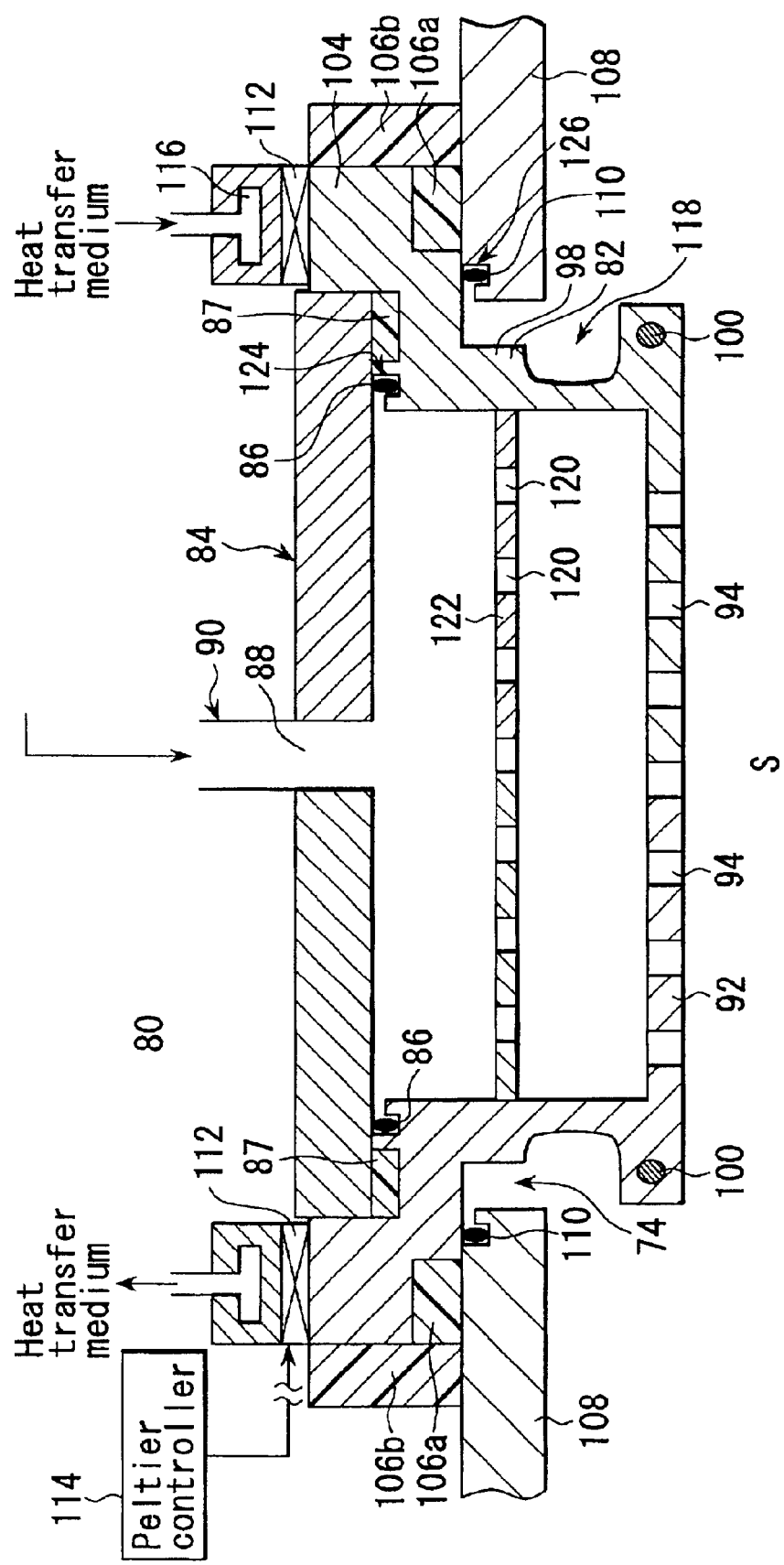
FIG. 2 is a sectional view showing a detailed constitution of the shower head structure shown in FIG. 1.
Figure 3:
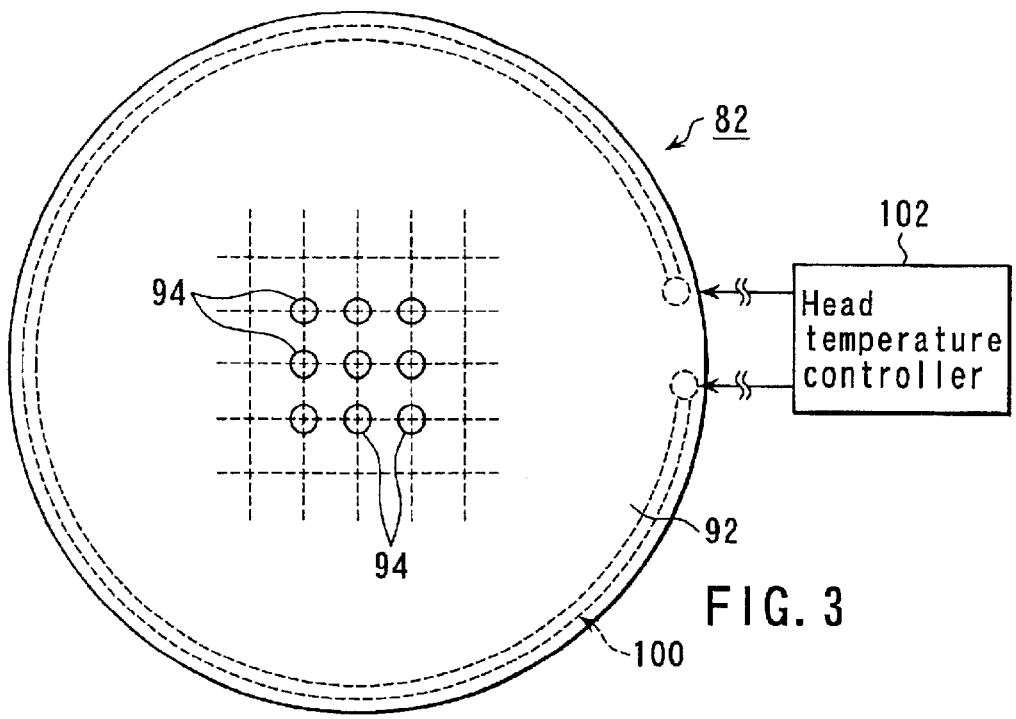
FIG. 3 is a plan view of the shower head structure shown in FIG. 1 as seen from the susceptor.

FIG. 1 is a sectional view showing a constitution in which one embodiment of a shower head structure according to the present invention is mounted on a film forming apparatus. Moreover, FIG. 2 is a diagram showing a detailed sectional constitution of the shower head structure, and FIG. 3 is a plan view of the shower head structure as seen from a susceptor.

A film forming apparatus 20 has a process chamber 22 molded in a cylindrical shape or a box shape, for example, using aluminum, and the like. A susceptor 28 supported by a holding member 26 having, for example, an L-shaped section is disposed on a cylindrical reflector 24 raised from an inner bottom surface of the process chamber 22. The reflector 24 is formed of aluminum, and an inner side thereof is mirror-polished, and the holding member 26 is formed of a heat-ray transmitting material such as quartz. Moreover, the susceptor 28 is formed, for example, of a carbon material, or AlN or another aluminum compound having a thickness of about 2 mm, and a semiconductor wafer (hereinafter referred to as the wafer) W as a material to be treated is laid on the susceptor 28.

Furthermore, a plurality of, for example, three lifter pins 30 (only two are representatively shown in FIG. 1) are disposed under the susceptor 28, and extended upward from one end of a support member 32. Additionally, the other end of the support member 32 is extended to the outside through a vertical slit (not shown) formed in the reflector 24. Respective other ends of the support members 32 are joined by annular joining members 34 so that the respective lifter pins move up/down together. Furthermore, the annular joining member 34 is connected to an upper end of a pushup rod 36 extended vertically through a bottom of the process chamber 22.

A lower end of the pushup rod 36 is connected to an actuator 42 through bellows 40 which can be expanded/contracted to hold an inner vacuum state in the process chamber 22. In this constitution, when the pushup rod 36 is moved upward by the actuator 42, the lifter pin 30 is pushed outside through a lifter pin hole 38 of the susceptor 28 to lift up the laid wafer W.

Moreover, a clamp mechanism 44 for pressing and fixing a peripheral edge of the wafer W on a susceptor 28 side is disposed in a periphery of the susceptor 28. The clamp mechanism 44 is mainly constituted of a clamp ring main body 46 which linearly contacts and fixes the peripheral edge of the semiconductor wafer W, and a coil spring 48 for moving the clamp ring main body 46 downward. The clamp ring main body 46 is formed of a substantially annular ceramic material along a contour shape of the wafer. Examples of the ceramic material include AlN.

The clamp ring main body 46 is connected to the support member 32 by a support rod 50 which is extended through the holding member 26 so as not to contact the holding member 26. For example, three support rods 50 (only two are representatively shown in FIG. 1) are disposed to support the clamp ring main body 46, and rise/fall integrally with the lifter pin 30.

Moreover, a transmission window 52 formed of a heat-ray transmission material such as quartz is attached to the bottom of the process chamber disposed directly under the susceptor 28 so that a vacuum state can be held. A box-shaped heating section 54 is disposed under the transmission window to enclose the transmission window 52. A plurality of heating lamps 56 as heating portions are disposed on a rotary base 58 which also serves as a reflective mirror in the heating section 54. The rotary base 58 is rotated by a rotating motor 60 disposed in a bottom of the heating section 54 via a rotating shaft. A heat ray emitted from the rotated heating lamp 56 is transmitted through the transmission window 52, and a lower surface of the susceptor 28 is irradiated with the heat ray and uniformly heated. Additionally, instead of the heating lamp 56, a resistance heater may be used as the heating portion in the susceptor 28.

Furthermore, on an outer periphery of the susceptor 28, an annular current plate 64 having a large number of current holes 62 is disposed and supported by a support column 66 which is molded in a vertical direction. An exhaust port 68 is disposed in a chamber bottom, beneath the current plate 64. An exhaust path 70 connected to a vacuum pump (not shown) is connected to the exhaust port 68, the process chamber 22 is evacuated, and a desired vacuum state is maintained. Moreover, a gate valve 72 opened/closed during supply/removal of the wafer is disposed on the side wall of the process chamber 22.

On the other hand, a relatively large opening 74 is formed in the ceiling portion of the process chamber 22 disposed opposite to the susceptor 28, and a shower head structure 80 for introducing a process gas, and the like into the process chamber 22 is sealed and fitted in the opening 74 so that the vacuum state can be maintained.

Concretely, as shown in FIG. 2, the shower head structure 80 has a cup-shaped head main body 82 formed, for example, of aluminum, and a head lid member 84 is attached to the opening side of the head main body 82 via a seal member 86 such as an O-ring. Moreover, the head lid member 84 includes an insulating member 87 formed of resin or the like and disposed along the O-ring on a surface which contacts the head main body 82. A gas introduction port 88 is disposed in a center of the head lid member 84. The gas introduction port 88 is connected to a gas supply system (not shown) of process gases such as $WF_6$, Ar, $SiH_4$, $H_2$, $N_2$, and the like for use during the film forming process and a gas supply system (not shown) of cleaning gases such as $ClF_3$ for use during cleaning in such a manner that a flow rate can be controlled.

As shown in FIG. 3, a large number of gas injection holes 94 for discharging the gas supplied into the head main body 82 to a processing space S are formed over the whole surface of a gas injection portion 92 as the bottom of the head main body 82, so that the gas is uniformly discharged to the surface of the wafer. The gas injection plate is molded integrally with the side wall of the head main body. In the prior art, the gas injection plate is separate from the head main body, attachment portions are interposed, heat conductivity between the gas injection plate and head main body deteriorates, and the materials of the gas injection plate and head main body are different from each other. Therefore, particles of these materials are generated due to frictional rubbing or grinding of their surfaces, which in turn behave differently due to differences in their thermal expansion coefficients. However, due to integral molding, the heat conductivity is enhanced, no particles are generated, and the problems are solved in this manner. When the insulating member 87 and the head lid member 84 also have the same structure, the same effect is obtained.

Moreover, a head heater 100 formed, for example, of an insulated sheath heater is provided in a lower end of a side wall 98 of the head main body 82 in an annular shape so that the heater is substantially circular, and mainly the head main body 82 is heated. The temperature of the head heater 100 is controlled to be within an arbitrary temperature range by a head temperature controller 102 shown in FIG. 3.

A joining flange portion 104 is disposed on an upper end of the head main body 82, and spreads in an outer peripheral direction. An annular insulating material 106a and a seal surface are disposed on a lower surface of the joining flange portion 104. When the head main body 82 is fitted in the opening 74 of the process chamber 22, a large contact portion with the upper surface of a ceiling portion 108 is contacted by an insulating material 106a and heat is not easily conducted. The insulating material 106a is formed of resin, or the like, a width thereof is formed to be a little smaller than the width of the contact surface, and a remaining contact surface forms a seal surface. Moreover, a seal member 110 formed of an O-ring or the like is interposed in a portion in which the upper surface of the ceiling portion 108 contacts the seal surface as the lower surface of the joining flange portion 104, so that the vacuum state can be maintained. Moreover, an insulating material 106b formed of resin or the like is disposed in an outer periphery of the joining flange portion 104.

Particularly, for the top surface of the ceiling portion 108 shown in FIG. 2, when the surface of the ceiling portion disposed on a vacuum side is set to be slightly low with respect to the seal surface, a slight gap is made to prevent the surface of the ceiling portion 108 from contacting the lower surface of the joining flange portion 104, and the vacuum state is held by the seal member 110. That is, when the surface of the ceiling portion 108 does not contact the seal surface of the joining flange portion 104, heat conduction is reduced, grinding by thermal expansion is eliminated, and particles can effectively be prevented from being generated. Additionally, the contact portion between the head main body 82 and head lid body 84 is similarly formed as shown in FIG. 2, heat conduction to the head lid body 84 from the head main body 82 is reduced during heating/cooling of the head main body 82 by a head heating/cooling portion described later, and the efficiency for heating/cooling the head main body 82 can be enhanced.

On the other hand, for example, a Peltier element 112 as the head heating/cooling port on is disposed in an annular shape on the upper surface of the joining flange portion 104 so that a lower surface (temperature adjustment surface) of the Peltier element 112 contacts the upper surface of the flange portion. The Peltier element 112 is used to heat or cool the joining flange portion 104 or the head main body 82 by control of a Peltier controller 114 if necessary.

A temperature control of the head main body 82 is, for example, in a range of 50 to 300° C., preferably 50 to 250° C. so that the head main body 82 is heated, for example, by a combination of Peltier element 112 and head heater 100 while maintaining uniformity of an in-plane temperature of the lower surface of the head main body 82.

A medium channel 116 formed similarly in an annular shape is disposed on the upper surface (temperature adjustment surface) of the Peltier element 112. When a heat transfer medium having a predetermined temperature is passed through the medium channel 116, a warm heat or a cool heat generated on the upper surface of the Peltier element 112 (in FIG. 2) is propagated.

Moreover, above the head heater 100 of the side wall 98 of the head main body 82, a bracket portion 118 for reducing a sectional area of the side wall is formed in an annular shape along an outer periphery of the side wall 98. When heat resistance of a vertical direction in the bracket 118 is increased, the heat generated in the head heater 100 is conducted along the head side wall 98 and cannot easily escape upward. Additionally, in the example of FIG. 2, the bracket portion 118 is formed by cutting the outer periphery of the side wall 98 in a concave shape. Instead, the inner periphery of the side wall may be cut to form the bracket portion.

Furthermore, a diffusion plate 122 with a large number of gas diffusion holes 120 formed therein is disposed in the head main body 82, and gas is more uniformly supplied to the surface of the wafer W. Furthermore, the respective seal members 86, 100 disposed in joined portions of constituting components of the shower head structure are fitted in annular seal grooves 124, 126 formed in concave sectional shapes.

A processing operation by a film forming apparatus on which the shower head structure of the present embodiment constituted as described above is mounted will next be described.

Here, in the present embodiment, as described above as the problem, the temperature of the head main body 82 during film formation cannot be raised to a temperature at which the reactive byproduct is not easily attached, depending upon a film forming process condition. On this case, while the temperature of the gas injection portion of the head main body 82 of the shower head structure 80 is maintained to be relatively low, the film forming process is performed. Thereby, the thickness of the film forming on the wafer W substantially becomes the same, reproducibility of the film thickness becomes very satisfactory, and the reactive byproduct which cannot easily be removed is also attached. Then, it is necessary to utilize the heating section of the constitution of the present embodiment to perform the cleaning process at a certain timing. Additionally, the cleaning process may be performed every time the film forming process ends, but the timing differs with a use situation on a user side. For example, it is judged whether a cumulative processing number, cumulative processing time, measured film thickness of the reactive byproduct, or electric property of the film on the wafer are within certain limits. For example, it is judged whether or not the cleaning process is to be performed in accordance with the cumulative processing number in a range of preferably 1 to 50 lots among 100 lots. After the film forming process of 25 wafers in one lot, the temperature of the surface of the gas injection portion of the head main body 82 is set to be the same as that of the film forming condition, and the cleaning process is performed. After processing of 20 lots, the temperature is set to be higher than the temperature of the gas injection portion of the head main body 82, and the cleaning process is automatically performed. In this sequence, the cleaning process may periodically be performed without any instruction from a user. Moreover, a small number and varieties of wafers are treated with different processes. In this case, every time one process ends, the cleaning process may automatically be performed.

First, when a metal film such as a tungsten film is formed on the surface of the wafer W in the film forming process, the gate valve 72 disposed on the side wall of the process chamber 22 is opened, and the wafer W is fed into the process chamber 22 by a conveying arm (not shown). When the lifter pin 30 is pushed up, the wafer W is transferred toward the lifter pin 30.

Subsequently, the lifter pin 30 is lowered by lowering the push-up rod 36, the wafer W is laid on the susceptor 28, and the peripheral edge of the wafer W is pressed and fixed by the clamp ring main body 46. Additionally, a titanium containing film such as a titanium metal film and a titanium nitride film is already deposited on the surface of the wafer W in the previous step.

Subsequently, the process gases such as $WF_6$, $SiH_4$, $H_2$ are propagated by carrier gases such as Ar and $N_2$ from a process gas supply system (not shown), and every predetermined amount of gas is supplied and mixed in the shower head structure 80. The mixed gas is diffused in the head main body 82 and substantially uniformly supplied into the process chamber 22 via the gas injection hole 94 in the lower surface of the main body.

During this gas supply, an inner atmosphere (mixed gas) is exhausted via the exhaust port 68, a predetermined vacuum value in the process chamber 22 is set, for example, in a range of 200 Pa to 11000 Pa, the heating lamp 56 positioned under the susceptor 28 is rotated and driven, and thermal energy (heat ray) is emitted.

After the emitted heat ray is transmitted through the transmission window 52, a back surface of the susceptor 28 is irradiated, and the wafer W is heated from the back surface thereof. Since the susceptor 28 has a thickness of about 2 mm and is very thin as described above, the susceptor 28 is quickly heated, and the wafer W laid on the susceptor 28 can also quickly be heated to a predetermined temperature. The supplied mixed gas causes a predetermined chemical reaction, and is deposited, for example, as the tungsten film on the whole surface of the wafer W.

In this case, the temperature of the wafer W is maintained at 480° C. or less (the temperature of the susceptor 28 is 500° C. or less). The temperature, particularly in the gas injection portion of the head main body 82 of the shower head structure 80, is controlled and maintained at 110° C. or less, preferably 95° C. or less.

In this case, since the head main body 82 receives much radiant heat from the susceptor 28 side, the temperature tends to rise to the set temperature of 95° C. or more. Therefore, the Peltier element 112 disposed in the joining flange portion 104 is driven to cool the lower surface of the main body. Thereby, the warm heat is taken from the head main body 82, and the main body is cooled. Moreover, the temperature of the gas injection portion of the head main body 82 is kept at 95° C. or less as described above.

In this case, the warm heat is generated on the upper surface of the Peltier element 112. The heat transfer medium formed of a fluid maintained, for example, at about 20 to 30° C., such as a Chiller (tradename), is passed through the medium channel 116 connected to the upper surface of the Peltier element 112. Moreover, the warm heat generated on the upper surface of the Peltier element 112 is transmitted to the outside. As the heat transfer medium, the heat transfer mediums having at least two types of temperature are necessary: a cooling heat transfer medium having a low temperature during the film forming process; and a heating heat transfer medium having a high temperature during the cleaning process. However, when time is required for changing the temperature of the heat transfer medium, time loss arises. Therefore, the medium channels for setting two systems of temperature are disposed in the constitution such that the temperature is changed in a short time. For example, it is possible to switch the film forming process and cleaning process in a short time by switching the valve.

Moreover, since the insulating material 106 is interposed in the joined portion of the chamber ceiling portion 108 and joining flange portion 104, the heat is inhibited from escaping to the ceiling portion 108 from the head main body 82. Also with an action of the Peltier element 112, the shower head structure 80 is substantially thermally insulated and floated, and mainly the head main body 82 can steadily be maintained at the desired temperature. That is, it is possible to maintain the head main body 82 steadily at a desired constant temperature during film formation. Additionally, when the temperature of the gas injection portion of the head main body 82 tends to become excessively low, the head heater 100 disposed on the side wall 98 is driven to appropriately heat the main body, and the temperature may be controlled.

During film formation, the tungsten film is formed on the wafer W at the temperature of the gas injection portion of the head main body 82 of 110° C. or less, preferably about 95° C. In this case, for example, when 25 wafers in one lot are continuously subjected to the film forming process, each film thickness substantially becomes the same, and reproducibility of the film thickness becomes very satisfactory. In this film forming process, the tungsten film is attached as an unnecessary film on portions other than wafer W, such as the surface of the susceptor 28 and the surface of the clamp ring main body 46. A large amount of generated titanium fluoride ($TiF_x$) based product combined with the reactive byproduct generated at this time, such as titanium in the titanium containing film on the wafer surface tends to be attached to the surface of the head main body 82.

Moreover, when a certain degree of cumulative processing number is obtained, the cleaning process for removing the unnecessary tungsten film or reactive byproduct is performed.

Here, a relation between the temperature of the gas injection portion of the shower head structure during film formation and reproducibility of film thickness, and a relation between the temperature of the gas injection portion of the shower head structure during the cleaning process and the removed amount of reactive byproduct were actually evaluated. Evaluation results will be described.

Figure 4:
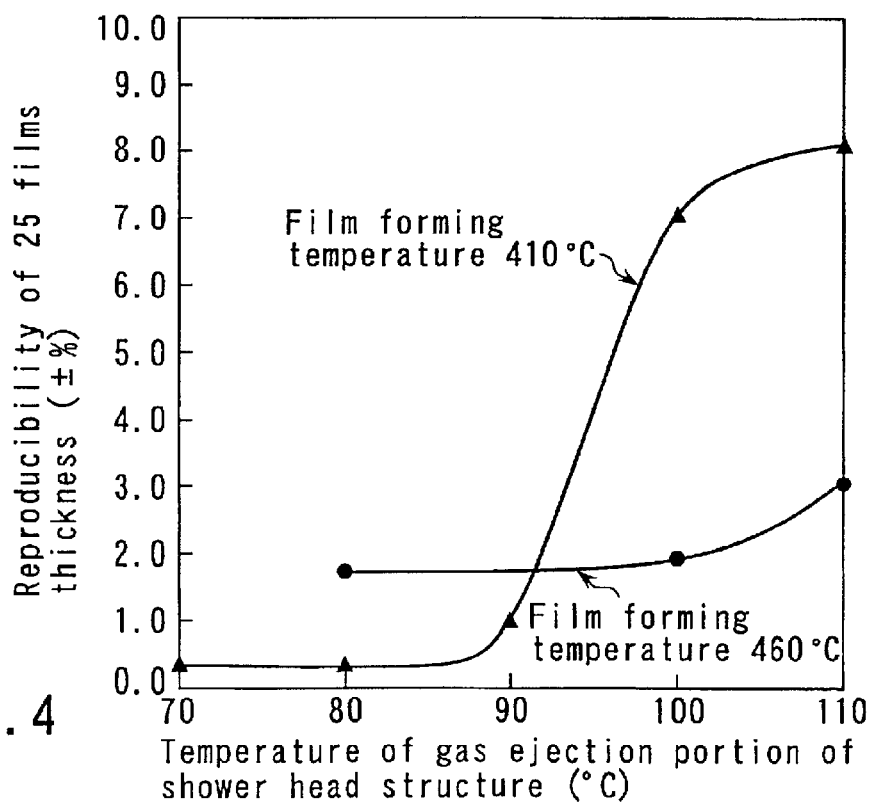
FIG. 4 is a diagram showing a relation between a temperature of the shower head structure during formation of a tungsten film (center portion of a gas injection portion) and reproducibility of film thickness.

FIG. 4 shows a relation between the temperature of the gas injection portion of the shower head structure during formation of the tungsten film and the reproducibility of film thickness. Here, each film thickness was measured after the continuous film formation on 25 wafers, and a relation between film fluctuations of 25 wafers and the temperature of the gas injection portion of the shower head structure was studied when the film forming temperature was 410° C. and 460° C.

As apparent from FIG. 4, the reproducibility of the film thickness is unchanged at the film forming temperature of 460° C., and a change ratio is 3% or less and causes no problem. However, when the film forming temperature is 410° C., and the temperature of the gas injection portion of the shower head structure drops to a range of 110° C. to 70° C., the reproducibility of the film thickness is enhanced (numeric value decreases). When the temperature of the gas injection portion of the shower head structure is set at 95° C. or less, the reproducibility of the film thickness is improved.

For example, when the temperature of the gas injection portion is 90° C. or less, the reproducibility is 1% or less.

Therefore, it has been found that the temperature of the gas injection portion of the shower head structure is set substantially at 95° C. or less and the tungsten film is deposited in order to enhance the reproducibility of the film thickness. Additionally, in this case, the amount of reactive byproducts (TiF based) attached to the surface of the gas injection portion of the shower head structure are inversely proportional to the temperature of the gas injection portion of the shower head structure, and inevitably increase. Moreover, in order to set the reproducibility of the film thickness within ±3%, the temperature of the head main body is set at 95° C. when the film forming temperature (slightly higher than the wafer temperature) is 420° C. or less. It has also been found that the temperature of the head main body may be set at 110° C. or less with a film forming temperature of substantially 500° C. or less.

Figure 5:
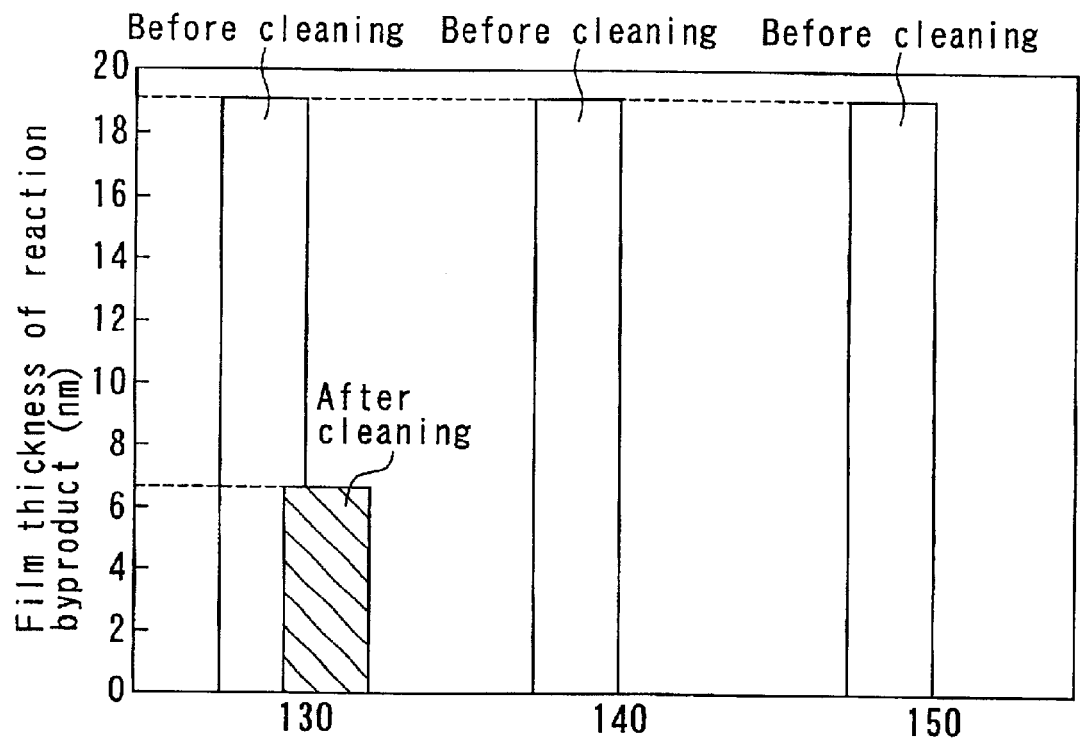
FIG. 5 is a diagram showing a relation between the temperature of the shower head structure during cleaning (center of the gas injection portion) and an amount of a removed reactive byproduct (TiFx).

FIG. 5 shows a relation between the temperature of the gas injection portion of the shower head structure during cleaning and the removed amount of reactive byproducts (TiF$_x$). In FIG. 5, examples of the temperature of the gas injection portion of the shower head structure include 130° C., 140° C., 150° C. Respective film thickness values of the reactive byproduct before and after the cleaning are shown.

For other cleaning conditions, a base temperature is 250° C., flow rate of ClF$_3$ is 500 sccm, pressure is 2666 Pa (20 Torr), cleaning time is 725 sec, and susceptor size is for 8 inches. As is apparent from this graph, when an initial film thickness is set substantially to 19 nm, and when the temperature of the gas injection portion of the shower head structure is 130° C., the reactive byproducts having a thickness of about 7 nm remains, and the cleaning cannot sufficiently be performed.

Therefore, it has also been found that the sufficient cleaning is achieved when the temperature of the head main body is higher than 130° C. On the other hand, when the temperature of the gas injection portion of the shower head structure is 140° C. and 150° C., a residual amount of reactive byproduct is zero. It has been found that the reactive byproduct can completely be removed. Therefore, the temperature of the gas injection portion of the shower head structure may be set substantially at 135° C. or more.

Figure 6:
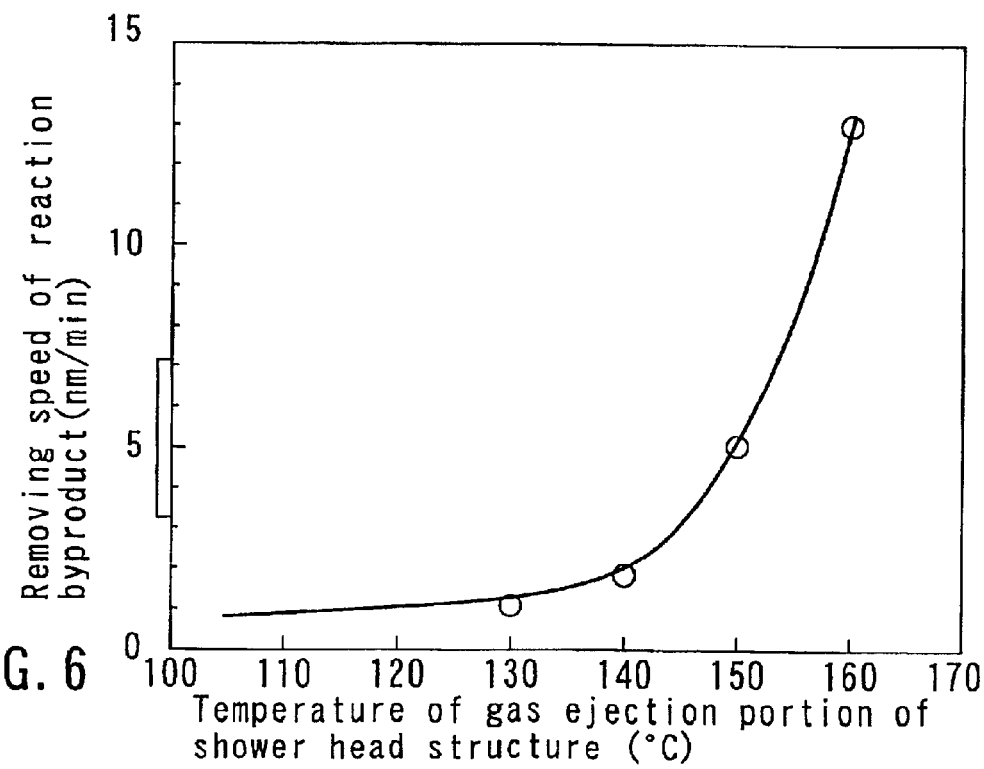
FIG. 6 is a diagram showing a relation between the temperature of a head main body during removal of the reactive byproduct by the present invention and a removal speed of the reactive byproduct.

FIG. 6 shows a relation between the temperature of the gas injection portion of the head main body 82 during removing of the reactive byproduct (TiFx, and the like) in the cleaning process (flushing) and a removing speed of the reactive byproduct. The relation will be described.

In this example, for the cleaning gas (ClF$_3$), a flow rate is in a range of 1 to 200 sccm, preferably 30 to 100 sccm, pressure is in a range of 0.133 to 1333 Pa, preferably 0.133 to 133 Pa, and flushing time is in a range of 1 to 150 min, preferably 5 to 100 min. When damage to the shower head structure 80 by flushing, and the effect of removal of the reactive byproduct are considered, a small flow rate and low vacuum are preferable. As concrete conditions of the flushing, for the cleaning gas, for example, the flow rate of ClF$_3$ gas is 50 sccm, pressure is 0.133 Pa, flushing time is 60 min., and the temperature of the gas injection portion of the shower head structure is 150° C. Under these conditions, the unnecessary tungsten film, and the reactive byproduct which is difficult to remove in the conventional cleaning method are removed.

In this case, the temperature of the susceptor 28 is maintained, for example, at about 250° C. which is substantially the same as that of the conventional cleaning process. On the other hand, the temperature of the head main body 82 and joining flange portion 104, particularly the surface temperature of the gas injection portion 92 is set, for example, at 130° C. or more, preferably in a range of 135 to 170° C. which is considerably higher than that of the conventional cleaning process in a range of 70 to 80° C.

In this setting, current in a direction reverse to that of the current In the film formation is passed through the Peltier element 112 disposed in the joining flange portion 104, the lower surface of the Peltier element 112 is heated, and the joining flange portion 104 and head main body 82 are heated from above. When the shower head structure 80 is heated from below by the head heater 100 and from above by the Peltier element 112, the head main body 82 (particularly the vicinity of the surface of the gas injection portion 92) is maintained at 135 to 170° C. Here, the heating temperature of 135 to 170° C. is set by the relation with the time required for the cleaning process. Even at 135° C. or less, it is possible to remove the reactive byproduct with a long time. Moreover, an upper limit of the heating temperature is not more than a corrosion temperature of the material of the gas injection portion 92 with respect to the cleaning gas. For example, with aluminum, the temperature is, for example, 400° C. or less.

When the shower head structure 80, particularly the head main body 82 is heated and maintained at 135 to 170° C. as described above, not only the unnecessary tungsten film but also the reactive byproduct difficult to remove in the conventional cleaning process, such as a titanium fluoride based product, are easily removed from the surface of the head main body 82, for example, mainly from the gas injection portion. In this case, since the bracket portion 118 for increasing heat resistance is disposed on the side wall of the head main body 82, heat is inhibited from escaping upward by heat conduction, and a heat insulating function is fulfilled. As a result, the temperature of the whole gas injection portion 92 can be maintained to be sufficiently high, and the reactive byproduct attached to the gas injection surface on the lower surface of the gas injection portion is securely removed. Moreover, uniformity of an in plane temperature of the gas injection portion 92 can also be enhanced by an action of the bracket 118.

Moreover, a temperature distribution of the head main body 82 was simulated and measured. The simulation result will be described.

Figure 7:
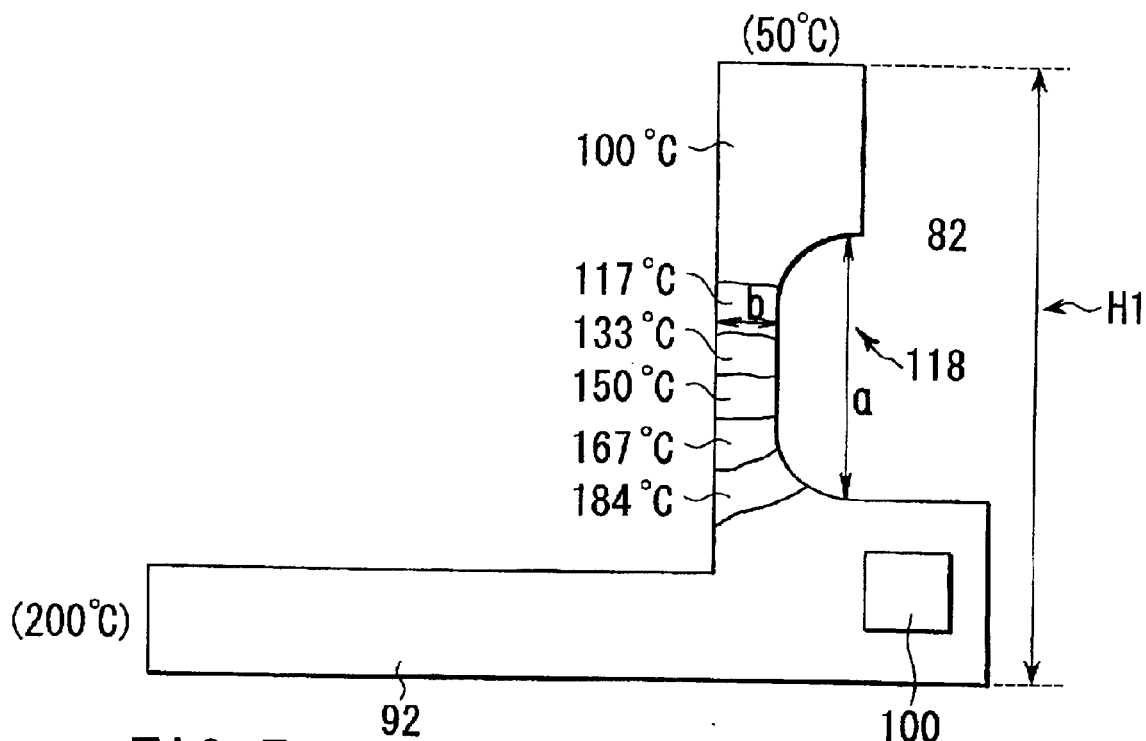
FIG. 7 is a diagram showing a simulation result of a temperature distribution of the head main body.
Figure 9:
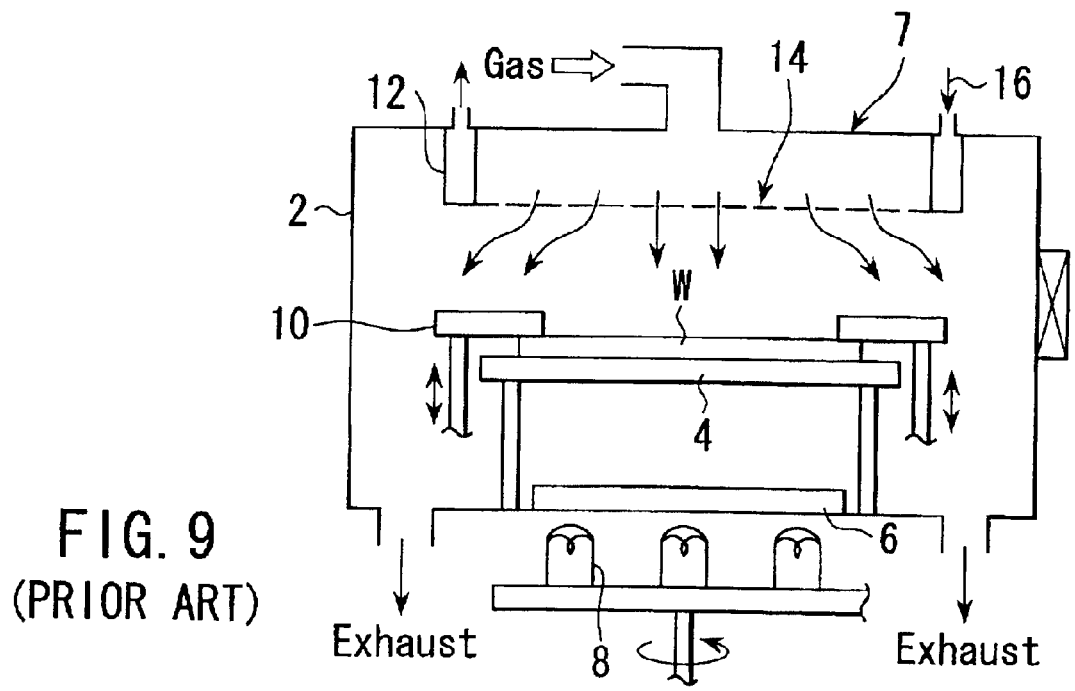
FIG. 9 is a diagram showing a constitution example of a film forming apparatus with a conventional shower head structure mounted thereon.

FIG. 7 shows the simulation result of the temperature distribution of the head main body. Here, the temperature of the upper end of the head main body 82 is set to 50° C., the temperature of the gas injection portion 92 is set to 200° C., and height H1 of the head main body 82 is 67 mm. As is apparent from the temperature distribution shown in FIG. 7, a temperature gradient in the bracket 118 becomes very large, that is, a temperature distribution curve becomes dense. It has been found that the heat insulating effect of the bracket 118 by the heat resistance with respect to the gas injection portion 92 is very superior and the head main body temperature is easily controlled in she structure.

Figure 8:
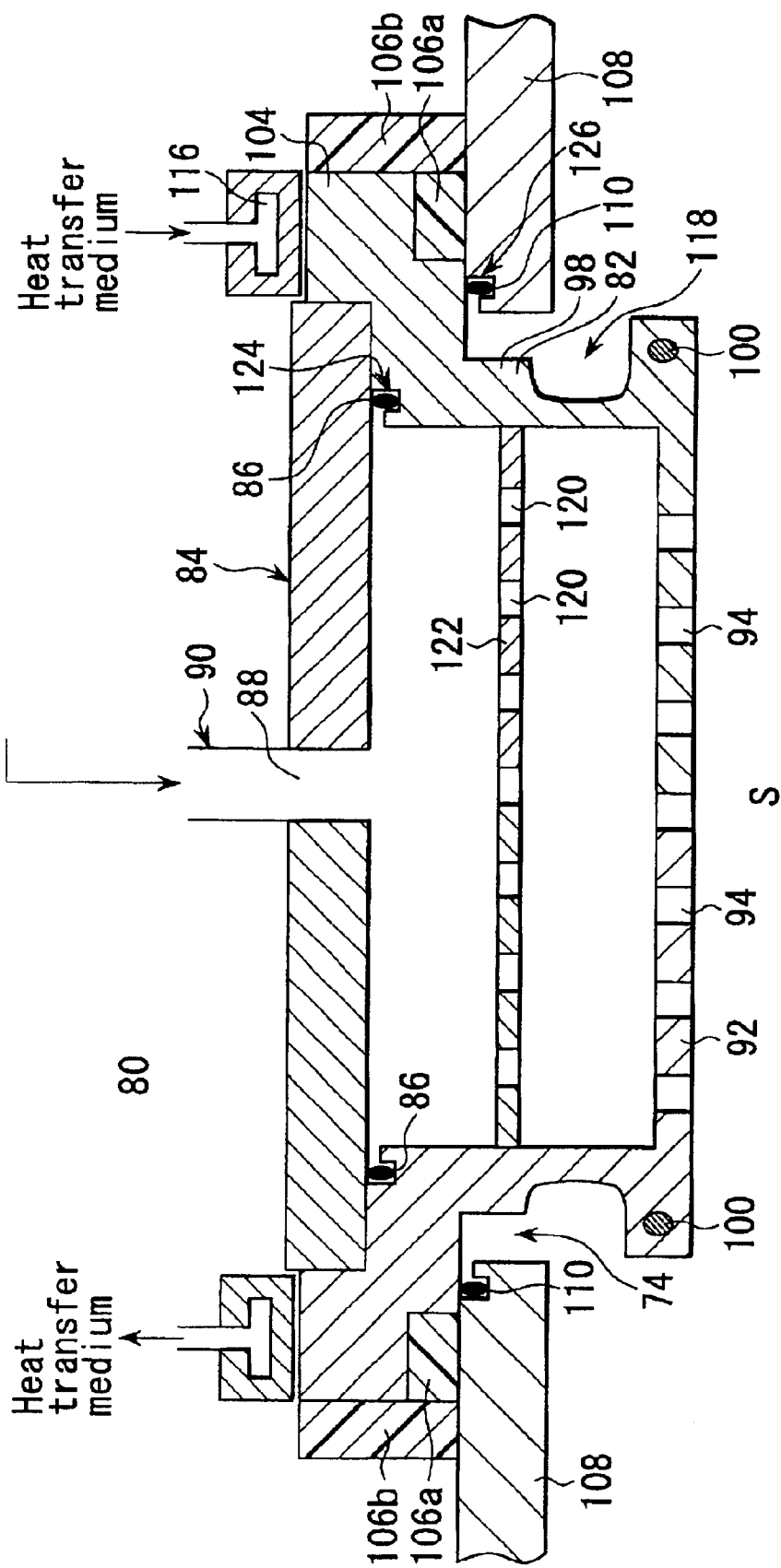
FIG. 8 is a sectional view showing a modification example of the shower head structure.
Figure 10:
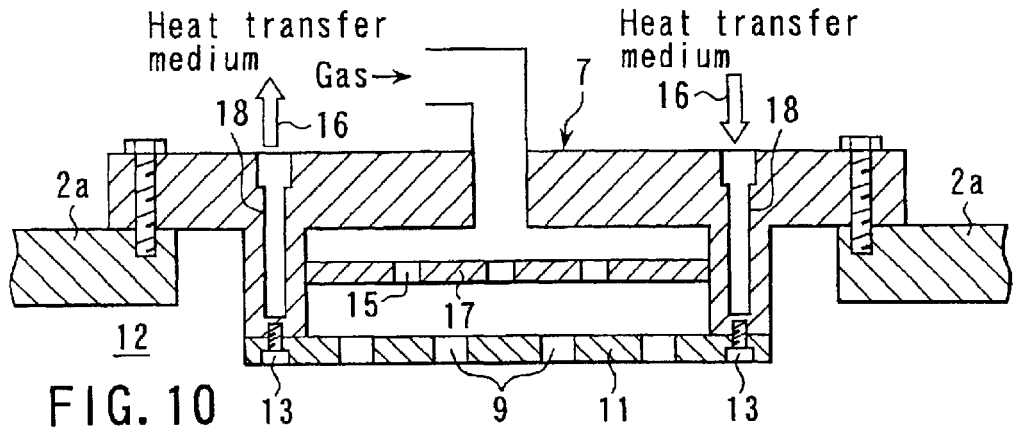
FIG. 10 is a sectional view showing a detailed constitution of the shower head structure shown in FIG. 9.
Figure 11A:
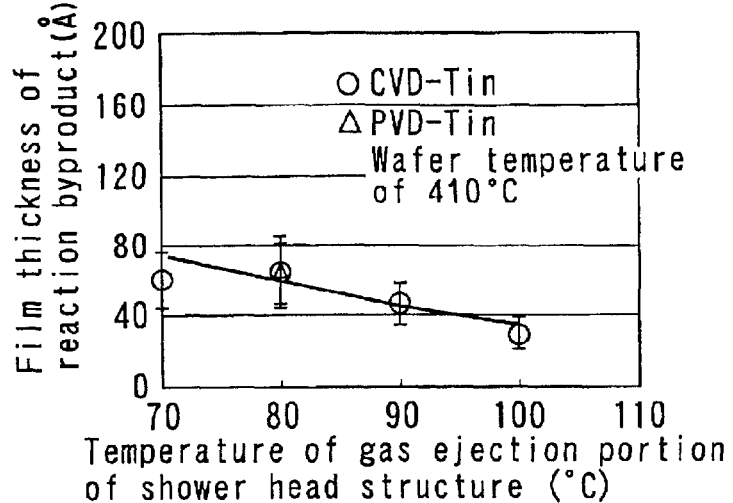
FIGS. 11A, 11B are diagrams showing a relation between the temperature of the gas injection portion of the shower head structure and film thickness of the reactive byproduct attached to the surface of the gas injection portion of the shower head structure.
Figure 11B:
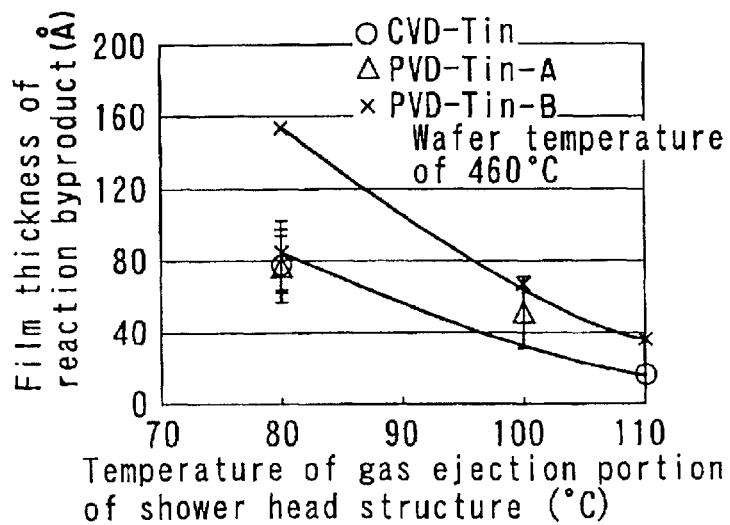

In this case, thickness and length of bracket portion 118 is 3–10 mm (b) and 10–50 mm (a). Moreover, in the present embodiment, the Peltier element 112 is disposed in the joining flange portion 104. However, as shown in FIG. 8, the medium channel 116 may directly be connected to the joining flange portion 104 without disposing the Peltier element 112. Even in this case, substantially the same action/effect can be achieved as compared with the case in which the Peltier element 112 is disposed.

Additionally, in the present embodiment, the example in which ClF$_3$ gas is used as the cleaning gas has been described. However, this is not limited, and the present invention can be applied to the case in which other cleaning gases such as a $NF_3$ gas, HCl gas, $Cl_2$ gas are used. The case of $NF_3$ gas use plasma. Moreover, here, the example in which the reactive byproduct (TiF) generated during depositing of the tungsten film is removed by cleaning has been described. The present invention can also be applied for removing the reactive byproduct generated during forming of the deposited film which contains other metals and metal compounds such as titanium (Ti), copper (Cu), tantalum (Ta), aluminum (Al), titanium nitride (TiN), and tantalum oxide ($Ta_2O_5$). Moreover, the present invention can also be applied to a plasma film forming apparatus for using plasma to generate a thin film. Furthermore, the material to be treated is not limited to the semiconductor wafer, and an LCD substrate, glass substrate, and the like can also be used.

As described above, according to the shower head structure and cleaning method of the present invention, the following superior action/effect can be fulfilled.

The injection plate (corresponding to the gas injection portion of the bottom of the head main body of the present invention) and joining flange portion (corresponding to a joining flange portion of the present invention), which have been separate from the head main body, are integrally molded. Therefore, even when there is a temperature change in the shower head structure, there is no possibility of occurrence of friction by a thermal expansion difference, and particles are inhibited from being generated.

The temperature of the gas injection portion of the shower head structure is maintained to be relatively low during the film forming process, so that the film thickness of the respective materials to be treated is substantially uniformed, and the reproducibility of the film thickness is enhanced and maintained to be high. Moreover, during the cleaning process, the temperature itself of the shower head structure is maintained to be higher than that of the film forming process by the head heater, and the reactive byproduct generated during the film forming process and attached to the surface of the gas injection portion of the shower head structure can be removed.

For the cleaning process, every time the film forming process ends, any one of the cumulative processing number, cumulative processing time, measured film thickness of the reactive byproduct, and specifications of the film formed on the wafer is used as a standard, and the user can appropriately set an execution timing.

The head main body of the shower head structure is integrally formed. Therefore, even when a temperature difference occurs among the gas injection portion, side surface and upper portion, the joined portion of the constituting member does not exist. Therefore, friction among the members attributed to the thermal expansion difference by the temperature difference is not generated, and particles can be prevented from being generated.

When the head main body of the shower head structure is attached to other constituting members, a slight gap is made by an insulating material of resin or the like, and therefore friction among the members can be eliminated.

Since the bracket portion is formed in the side surface of the head main body, heat conduction is reduced. Additionally, since the heat conduction is reduced by the insulating material, heat is inhibited from escaping from the gas injection surface side of the head main body by the heat resistance of the bracket portion and the insulating material during the cleaning process. The temperature of the portion of the gas injection surface is maintained to be high. Furthermore, uniformity of the in-plane temperature is enhanced, and the reactive byproducts can efficiently be removed.

The head heating/cooling portion cools the head main body during the film forming process to further enhance reproducibility of the film thickness, and heats the head main body during the cleaning process in order to further efficiently remove the reactive byproduct.

For the heat transfer medium for propagating the warm heat generated in the upper surface of the Peltier element disposed in the upper portion of the head main body to the outside, there are a cooling medium having a low temperature for use in the film forming process, and a heating medium having a high temperature for use in the cleaning process. The mediums can be switched in a short time, and switched and utilized.

During the film forming process and cleaning process, the heat transfer medium is used to remove the warm heat or the cool heat generated on the upper surface of the Peltier element, so that the shower head structure can thermally be floated.

Since the temperature of the shower head structure can steadily be maintained to be constant, the in-plane uniformity of the film thickness can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A shower head structure provided on an upper portion of a process chamber for subjecting a material to be treated to a film forming process, for supplying a predetermined gas into the process chamber, the shower head structure comprising:
   a head main body formed in a cup shape having a gas injection portion with a plurality of gas injection holes provided therein in a bottom of the cup shape;
   a joining portion to attaching the head main body to the upper portion of the process chamber;
   a head heating portion, disposed on the head main body, for adjusting the head main body at a desired temperature; and
   a seal member having a seal surface formed between the process chamber and the joining portion of the head main body, wherein a portion of the seal surface attached to the upper portion keeps the process chamber hermetic and a gap is made between the seal surface on a vacuum side of the process chamber and the upper portion.

2. The shower head structure according to claim 1, further comprising an insulating material in a seal surface between the joining portion and the process chamber.

3. The shower head structure according to claim 1, wherein a contact surface of the joining portion on the vacuum side of the process chamber is formed to be lower than that on an atmospheric side so that a gap is made between the contact surface on the vacuum side and the ceiling portion.

4. The shower head structure according to claim 1, further comprising a bracket portion for reducing a sectional area of the side wall of the head main body and for increasing a heat resistance to a propagated heat on the side wall.

5. The shower head structure according to claim 1, further comprising a head heating/cooling portion, disposed on the joining portion, for cooling or heating the head main body.

6. The shower head structure according to claim 5, wherein the head heating/cooling portion comprises:
   a Peltier element disposed such that one temperature adjustment surface contacts the joining portion; and
   a controller for driving/controlling the Peltier element.

7. The shower head structure according to claim 6, further comprising: a medium channel, disposed to contact the other temperature adjustment surface of the Peltier element, for passing a heat transfer medium for propagating a warm heat or a cool heat generated by the temperature adjustment surface to the outside.

8. The shower head structure according to claim 6, wherein the heat transfer medium comprises a first heat transfer medium for cooling the Peltier element, and a second heat transfer medium for heating the Peltier element, and
   the first heat transfer medium and the second heat transfer medium contact the temperature adjustment surface of the Peltier element via respective different medium channels, and either one of the first heat transfer medium and the second heat transfer medium is selected by switching a valve.

9. The shower head structure according to claim 1, further comprising a head lid body attached to the top end portion of the head main body with a seal member interposed therebetween.

10. The shower head structure according to claim 9, further comprising a heat insulating member in a contact portion between the top end portion of the head main body and the head lid body.

11. The shower head structure according to claim 9, further comprising a diffusion chamber which diffuses the gas between the head main body and the head lid body to uniformly supply the gas into the process chamber.

12. The shower head structure according to claim 11, further comprising a diffusion plate having a number of gas distribution holes in the diffusion chamber.

13. The shower head structure according to claim 9, wherein a contact portion between the top end portion of the head main body and the head lid body on a vacuum side is lower than that on an atmospheric side, so that a gap is formed.

14. The shower head structure according to claim 1, wherein the joining portion is formed integrally with the head main body.

15. A shower head structure, disposed on an upper portion of a process chamber for subjecting a material to be treated to a film forming process, for supplying a predetermined gas into the process chamber, the shower head structure comprising:
   a head main body having a gas injection portion with a plurality of gas injection holes provided therein in a bottom of the shower head structure;
   a joining portion to be attached to the upper portion of the process chamber;
   a head heating portion, disposed on the head main body, for adjusting the head main body at a desired temperature; and
   a head heating/cooling portion, disposed on the joining portion, for cooling the head main body during the film forming process of the material to be treated, and heating the head main body during a cleaning process in the process chamber,
   wherein the temperature of the head main body is controlled in a range of 50 to 300° C. by the head heating portion and the head heating/cooling portion.

16. The shower head structure according to claim 15, which is mounted on a film forming apparatus comprising the process chamber for depositing a reactive byproduct on the surface of the heated material to be treated in a process gas atmosphere.

17. The shower head structure according to claim 15, which is mounted on a plasma film forming apparatus comprising the process chamber for depositing a reactive byproduct on the surface of the heated material to be treated in a process gas atmosphere under generation of a plasma.

18. The shower head structure according to claim 15, wherein the head heating/cooling portion comprises a medium channel, disposed to contact the joining portion, for passing a heat transfer medium for propagating a warm heat or a cool heat generated by the joining portion to the outside.

19. The shower head structure according to claim 18, wherein the heat transfer medium comprises a first heat transfer medium for cooling the Peltier element during the film forming process, and a second heat transfer medium for heating the Peltier element during the cleaning process in the process chamber.

20. The shower head structure according to claim 15, wherein the joining portion is formed integrally with the head main body.

21. A film forming method by a shower head structure disposed on a process chamber for subjecting a material to be treated to a film forming process, the shower head structure comprising:
   a head main body having a gas injection portion with a plurality of gas injection holes opened therein, and a joining portion to be attached to the process chamber;
   a head heating portion, disposed on the head main body, for adjusting the head main body at a desired temperature; and
   a head heating/cooling portion, disposed on the joining portion, for cooling or heating the head main body, the method comprising steps of:
   introducing a predetermined gas into the process chamber having a vacuum state from the shower head structure;
   subjecting the material to be treated in the process chamber to a film forming process; and
   maintaining the temperature of the gas injection portion to a constant temperature in a range of 50 to 300° C. by the head heating portion and the head heating/cooling portion.

22. The film forming method according to claim 21, wherein when the temperature of the film forming process is 500° C. or less by the head heating/cooling section, the temperature of the shower head structure is set to 110° C. or less.

23. The film forming method according to claim 21, wherein the temperature of the shower head structure is set to 95° C. or less.

24. The film forming method according to claim 21, further comprising steps of adjusting the temperature of the surface of the gas injection portion generated during film formation, inhibiting heat from being propagated to the joining portion, and forming a film by a bracket formed on the side wall of sax the head main body disposed above the gas injection portion.

25. The shower head structure according to claim 21, wherein the joining portion is formed integrally with the head main body.

26. A shower head structure provided on an upper portion of a process chamber for subjecting a material to be treated to a film forming process, for supplying a predetermined gas into the process chamber, the shower head structure comprising:
- a head main body having a gas injection portion with a plurality of gas injection holes provided in a bottom;
- a joining portion to attach the head main body to the upper portion of the process chamber;
- a head heating portion, disposed on the head main body, for adjusting the head main body at a desired temperature; and
- a bracket portion for reducing a sectional area of the side wall of the head main body and for increasing a heat resistance to a propagated heat on the side wall.

27. The shower head structure according to claim 26, further comprising a beat insulating material in a seal surface between the joining portion and the process chamber.

28. The shower head structure according to claim 26, wherein a portion of the seal surface attached to the upper portion between the joining portion of the heat main body and the process chamber is held hermetic by a seal member, and a gap is made between the seal surface on a vacuum side of the process chamber and the upper portion.

29. The shower head structure according to claim 28, wherein a contact surface of the joining portion on a vacuum side is lower than that on an atmospheric side.

30. The shower head structure according to claim 26, further comprising a head heating/cooling portion, disposed on the joining portion, for cooling or heating the head main body.

31. The shower head structure according to claim 30, wherein the head heating/cooling portion comprises:
- a Peltier element disposed such that one temperature adjustment surface contacts the joining portion; and
- a controller for driving/controlling the Peltier element.

32. The shower head structure according to claim 26, wherein the head main body is formed in a cup shape.

33. The shower head structure according to claim 26, further comprising a head lid body attached to the top end portion of the head main body with a seal member interposed therebetween.

34. The shower head structure according to clam 33, further comprising a heat insulating member in a contact portion between the top end portion of the head main body and the head lid body.

35. The shower head structure according to claim 34, wherein a contact portion between the top end portion of the head main body and the head lid body on a vacuum side is lower than that on an atmospheric side, so that a gap is formed.

36. The shower head structure according to claim 26, wherein the joining portion is formed integrally with the head main body.

37. A shower head structure provided on an upper portion of a process chamber for subjecting a material to be treated to a film forming process, for supplying a predetermined gas into the process chamber, the shower head structure comprising:
- a head main body having a gas injection portion with a plurality of gas injection holes;
- a joining portion to attach the head main body to the upper portion of the process chamber;
- a head heating portion, disposed on the head main body, for adjusting the head main body at a desired temperature; and
- a head heating/cooling portion, disposed on the joining portion, for cooling or heating the head main body.

38. The shower head structure according to claim 37, further comprising an insulating material in a seal surface between the joining portion and the process chamber.

39. The shower head structure according to claim 37, wherein a portion of the seal surface attached to the upper portion between the joining portion of the heat main body and the process chamber is held hermetic by a seal member, and a gap is made between the seal surface on a vacuum side of the process chamber and the upper portion.

40. The shower head structure according to claim 37, wherein the head main body is formed in a cup shape.

41. The shower head structure according to claim 37, wherein a contact surface of the joining portion on a vacuum side is lower than that on an atmospheric side.

42. The shower head structure according to claim 37, further comprising a head lid body attached to the top end portion of the head main body with a seal member interposed therebetween.

43. The shower heal structure according to claim 42, further comprising a heat insulating member in a contact portion between the top end portion of the head main body and the head lid body.

44. The shower head structure according to claim 43, wherein a contact portion between the top end portion of the head main body and the head lid body on a vacuum side is lower than that on an atmospheric side, so that a gap is formed.

45. The shower head structure according to claim 37, wherein the joining portion is formed integrally with the head main body.

46. The shower head structure according to claim 37, wherein the head heating/cooling portion comprises:
- a Peltier element disposed such that one temperature adjustment surface contacts the joining portion; and
- a controller for driving/controlling the Peltier element.

* * * * *